United States Patent [19]
Hamstra

[11] 3,936,706
[45] Feb. 3, 1976

[54] CONTROL CIRCUIT
[75] Inventor: David C. Hamstra, Clinton, Iowa
[73] Assignee: General Electric Company, Fort Wayne, Ind.
[22] Filed: Sept. 18, 1974
[21] Appl. No.: 506,998

[52] U.S. Cl.... 317/148.5 B; 307/246; 307/252 UA; 317/DIG. 4
[51] Int. Cl.² ........................................ H03K 17/56
[58] Field of Search ...... 317/148.5 R, 148.5 B, 149; 307/246, 252 UA, 106

[56] References Cited
UNITED STATES PATENTS

| | | | |
|---|---|---|---|
| 3,179,866 | 4/1965 | Doyle et al. | 317/148.5 B X |
| 3,267,337 | 8/1966 | Doyle et al. | 317/148.5 B |
| 3,345,546 | 10/1967 | Beltrand | 317/148.5 B |
| 3,662,190 | 5/1972 | Naber | 307/252 UA X |
| 3,671,761 | 6/1972 | Shibuya et al. | 317/148.5 B |
| 3,715,605 | 2/1973 | Naber | 307/252 UA X |

Primary Examiner—J. D. Miller
Assistant Examiner—Harry E. Moose, Jr.
Attorney, Agent, or Firm—Joseph E. Papin

[57] ABSTRACT

A control for supplying not more than one complete cycle of an alternating current upon command. The circuit has a plurality of gate controlled switching devices and a command switch. An energy storage device has one of the switching devices connected in the circuit for conducting a short time after the beginning of each current excursion of a specific polarity, and another of the switching devices is connected in series between a power source and a load for supplying energy to the load when gated. A third switching device is adapted to conduct, when gated, for depleting energy from the storage device only when the command switch so indicates. Conduction of the third switching device gates the other switching device and occurs only during current excursions of the desired polarity when the one switching device is non-conducting.

15 Claims, 1 Drawing Figure

U.S. Patent   February 3, 1976   3,936,706
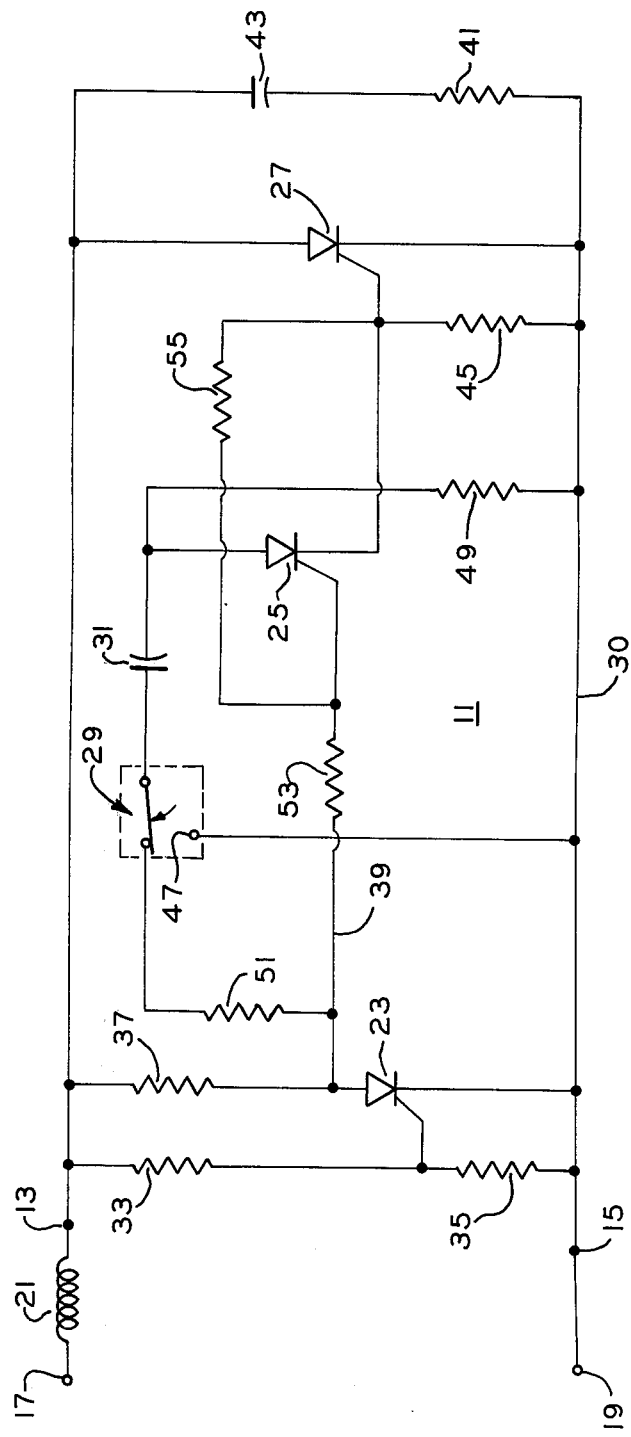

CONTROL CIRCUIT

BACKGROUND OF THE INVENTION

The present invention relates generally to control circuits and more particularly to such circuits for supplying a single pulse to actuate a load.

In the past, various circuitry was employed to effect actuation of single stroke, electrically operable, hand held tools, such as a fastener driving tool or the like. The art is replete with schemes which provided single energy pulses to actuate, for example, solenoid operated devices, such as electric typewriters, paper tape punches, fastener driving devices and the like. At least some of these schemes frequently employed an accumulated charge on a large storage capacitor as an energy source which actuated the solenoid with appropriate gating occurring upon command. Another approach frequently employed was to utilize a capacitor for triggering a silicon controlled rectifier to gate substantially a half cycle of an applied alternating current to the solenoid thereby to operate the device. A variation on some of these schemes was to employ two solenoids and to gate two consecutive half cycles of the alternating current sequentially to these two solenoids to provide a greater driving force for the tool or device. One of the disadvantageous or undesirable features of at least some of these trigger capacitor type schemes was that the firing of the silicon controlled rectifier did not adequately discharge the trigger capacitor, and accordingly, the circuit refired on a subsequent half cycle of like polarity. Such refiring, i.e. "doubling" or even "tripling", was in the least annoying and, in the case of fastener driving machinery that automatically reloaded itself between firings, might have been quite dangerous to the operator.

SUMMARY OF THE INVENTION

Among the several objects of the present invention may be noted the provision of a control circuit which overcomes the disadvantageous and undesirable features discussed hereinabove, as well as others, with respect to the prior art; the provision of an improved half wave or pulse gating control circuit; the provision of a control circuit for supplying not more than one complete cycle of an alternating current from a source to a load; the provision of a control circuit in which the reliability and safety are insured against refiring on a subsequent half cycle of alternating current; and the provision of a control circuit which is simplistic in its design, economical to manufacture, and easily assembled. Other objects and features will be in part apparent and in part pointed out hereinafter.

In general, a control circuit in one form of the invention is provided for supplying not more than one complete cycle of an alternating current from a source thereof to a load upon command. The control circuit has a plurality of gate controlled switching devices, each non-conducting until simultaneously properly poled and gated to thereafter conduct until the current therethrough decreases below a conduction threshold, and a multiple state command switch. An energy storage device selectively accumulates energy during current excursions of one polarity and only when the command switch is in a first state. A first of the switching devices begins conducting a short time interval after the beginning of each current excursion of the other polarity, a second of the switching devices is connected in series between the source and the load for supplying electrical energy to the load when gated. A third of the switching devices conducts, when gated, to deplete the store of energy in the storage device only when the command switch is in a second state. Conduction of the third switching device gates the second switching device, and gating of the third switching device occurs only during current excursions of the other polarity and when the first switching device is non-conducting.

Also in general and in one form of the invention, a control circuit is provided for connection across a pair of terminals in series with a source of alternating current and a load with one of the terminals connected to the source and the other of the terminals connected to the load so that the load may be energized only by conduction between the terminals. A gate controlled solid state switching device is coupled between the terminals to energize the load when gated to a conducting state, and means is connected between the terminals for providing periodic synchronizing signals at the beginning of selected half cycles of the alternating current voltage across the terminals. An energy storage device selectively accumulates electrical energy during half cycles of a polarity opposite the selected half cycles of the alternating current voltage across the terminals; and a multiple state manually operable command switch is normally biased to a first state to couple the energy storage device to the terminals thereby to accumulate energy and is changeable to a second state upon command. Means including the energy storage device provides a gating signal to the solid state switching device to energize the load upon the first occurrence of a synchronizing signal after the command switch has been changed to its second state and thereafter provides no further gating signals until at least the command switch has returned to its first state. Means is associated with the gating signals providing means for effecting a generally low impedance electrical energy discharge path during substantially the entire selected half cycle following a gating signal to insure substantially complete dissipation of the accumulated electrical energy.

BRIEF DESCRIPTION OF THE DRAWING

The drawing is a schematic diagram of a control circuit in one form of the invention.

Corresponding reference characters indicate corresponding parts throughout the drawing.

The following examples illustrate the invention in one form thereof and are not to be construed as limiting in any manner.

DESCRIPTION OF THE PREFERRED EMBODIMENT

Referring now to the drawing in greater detail, there is indicated generally at 11 a control circuit comprising that circuitry illustrated to the right of terminals 13, 15. The two terminal control circuit 11 is connected in series between a source of alternating current (not shown), such as the typically encountered 120 volt or 240 volt 60 Hertz source, as applied across a pair of power terminals 17, 19, and a load, as represented by a coil 21 of a solenoid operated portable tool (not shown). Terminals 13, 15 function as a series interconnection for the source and load, and there must be conduction between terminals 13, 15 for the load to be energized.

Control circuit 11 includes a plurality of solid state, gate controlled switching devices 23, 25, 27, such as silicon controlled rectifiers or the like for instance, which are non-conducting until they are simultaneously properly poled and gated and which thereafter conduct until current therethrough decreases below a conduction threshold. Switching devices 23 and 27 have their cathodes directly connected to a common conductor 30. A multiple state command switch, such as a single-pole, double-throw manually operable switch indicated generally at 29, is employed in the circuit, and the command switch may be spring biased in the position illustrated and as depicted by the directional arrow in the drawing. Command switch 29 is connected to an energy storage device, such as a capacitor 31, which functions to selectively accumulate energy during current excursions of one polarity only when the command switch is in the position shown.

A type of synchronization for control circuit 11 is provided by switching device 23 which is subjected to alternating current voltage between terminals 13, 15 by way of a plurality of resistors 33, 35, 37. For example, when the voltage across terminals 13, 15 is zero and changing such that terminal 13 will become positive relative to terminal 15, switching device 23 is non-conducting for a short time interval. However, the voltage divider effect of resistors 33, 35 will soon provide sufficient gate current to switching device 23 which then begins conducting to effectively ground a line 39 thereafter for the remainder of that half cycle of the voltage across control circuit 11. It may be noted that there is a short interval at the beginning of this half cycle where the potential on line 39 is positive, and this interval provides a periodic synchronizing function for control circuit 11.

When terminal 15 is positive relative to terminal 13, current will flow by way of a resistor 49, capacitor 31, another resistor 51, and resistor 37 to charge the capacitor with the right hand plate thereof positive relative to the left hand plate. Gate controlled switching device 25 will conduct only when a pair of prerequisite operating conditions are simultaneously present. One of these operating conditions occurs when comand switch 29 is manually depressed so as to connect the left plate of capacitor 31 to a command switch contact or terminal 47 and thereby also to common line 30, and the other of these operating conditions is the occurrence of a short positive potential signal on line 39 prior to the conduction of switching device 23. If either of these two prerequisite operating conditions is absent, gate controlled switching device 25 remains in its non-conducting state. However, when both of the two operating conditions occur, typically by manually depressing command switch 29 and waiting for the next appropriate portion of the alternating current applied voltage, switching device 25 will conduct from anode to cathode and by way of a resistor 45 to discharge capacitor 31. This conduction provides a voltage across resistor 45 thereby establishing a gating signal to gate controlled switching device 27 which, in turn, passes substantially one-half cycle of the applied alternating current through load 21. Thus, energization of load 21, may be utilized to enable a solenoid operated tool (not shown).

It may be noted that due to the presence of a plurality of current limiting resistances, such as those indicated at 33, 35, 37, currents which flow through the control portions of the control circuit 11 are inadequate for energizing load 21. Further, a pair of current limiting resistances, such as those indicated at 53, 55, insure not only that load 21 will not be energized but further that gate controlled switching device 25 will not be enabled unless the two aforementioned prerequisite operating or enabling conditions concur. As previously noted, these prerequisite operating conditions will concur when the periodic synchronizing signals indicative of or occurring at the beginning of selected half cycles of the alternating current are supplied to switching device 25 by way of resistor 53, and command switch 29 is depressed to allow capacitor 31 to bias the switching device in its conducting direction and to discharge that capacitor when the switching device receives its gating signal. The series combination of a resistor 41 and a capacitor 43 is provided in parallel with switching device 27 to prevent line transients from causing misfirings of the switching device. Additionally, rather high voltages may be impressed across switching device 27 when it is in its non-conducting state due to, for example, the presence of a substantial inductance or capacitance in load 21. Accordingly, a voltage overload protecting device (not shown), such as a metal oxide varistor having a voltage variable impedance for instance, may also be connected in parallel with switching device 27 for preventing undesirably high voltages across that switching device.

When command switch 29 is depressed and the aforementioned synchronizing signal is supplied to the gate of switching device 25, complete discharging of capacitor 31 is insured since such solid state switching devices do not depend upon a continuous gating signal but rather conduction through them is extinguished after once begun only due to the current diminishing below a relatively small threshold value. Thus control circuit 11 will substantially completely discharge capacitor 31 by way of switching device 25, resistor 45, and switch terminal or contact 47. Such a complete discharging through this low impedance insures that the aforementioned disadvantageous feature of "doubling" or refiring is eliminated.

From the foregoing it is now apparent that a novel control circuit 11 has been presented meeting the objects and advantageous features set out hereinbefore as well as others. Further it is contemplated that changes as to the arrangements, details, and connections of the component parts of control circuit 11, as well as the load it is employed to enable, which have been presented to illustrate the invention in one form thereof may be made by those skilled in the art without departing from the spirit of the invention or the scope thereof which is set out in the claims which follow.

What I claim as new and desire to secure by Letters Patent of the United States is:

1. A control circuit for supplying not more than one complete cycle of alternating current from a source thereof to a load upon command comprising a plurality of gate controlled switching devices each non-conducting until simultaneously properly poled and gated to thereafter conduct until the current therethrough decreases below a conduction threshold, a multiple state command switch, and an energy storage device for selectively accumulating energy during current excursions of one polarity and only when the command switch is in a first state, a first of the switching devices being connected in the circuit to begin conducting a short time interval after the beginning of each current excursion of the other polarity, a second of the switching devices being connected in the circuit in series between the source and the load for supplying electrical energy to the load when gated, a third of the switching devices being connected in the circuit to conduct when gated to deplete the store of energy in the storage device only when the command switch is in a second state, the conduction of the third switching device gating the second switching device, and gating of the third switching device occurring only during current excursions of the other polarity and when the first switching device is non-conducting.

2. A control circuit as set forth in claim 1, wherein the load is constituted by a coil of a solenoid operated portable tool.

3. A control circuit as set forth in claim 1, wherein the multiple state command switch is constituted by a manually operable single-pole double-throw switch.

4. A control circuit as set forth in claim 1, wherein the command switch comprises a manually operable switch biased in its first state and operable to its second state to provide substantially a single half cycle of alternating current to the load for each manual operation of the switch.

5. A control circuit as set forth in claim 1, wherein the energy storage device comprises a capacitor, the capacitor accumulating energy by way of a series circuit including the command switch in its first state.

6. A control circuit as set forth in claim 1, wherein the switching devices each comprises a solid state switch having anode and cathode terminals and enabled to pass positive current flow from anode to cathode by a positive current flow from gate to cathode.

7. A control circuit as set forth in claim 6, wherein the cathodes of the first and second switching devices are directly connected to a common conductor, the cathode of the third switching device being resistively coupled to the common conductor and directly connected to the gate of the second switching device.

8. A control circuit as set forth in claim 6, wherein the energy storage device comprises a capacitor, the command switch being effective in its second state to connect one side of the capacitor to the common conductor.

9. A control circuit for connection across a pair of terminals in series with a source of alternating current and a load with one of the terminals connected to the source and the other of the terminals connected to the load so that the load may be energized only by conduction between the terminals comprising:

a gate controlled solid state switching device coupled between the terminals to energize the load when gated to a conducting state;

means connected between the terminals for providing periodic synchronizing signals at the beginning of selected half cycles of the alternating current voltage across the terminals;

an energy storage device for selectively accumulating electrical energy during half cycles of a polarity opposite the selected half cycles of the alternating current voltage across the terminals;

a multiple state manually operably command switch normally biased to a first state to couple the energy storage device to the terminals to accumulate energy and changeable to a second state upon command;

means including the energy storage device for providing a gating signal to the solid state switching device to energize the load upon the first occurrence of a synchronizing signal after the command switch has been changed to its second state and thereafter providing no further gating signals until at least the command switch has returned to its first state; and means associated with the gating signal providing means for effecting a generally low impedance electrical energy discharge path during substantially the entire selected half cycle following a gating signal to insure substantially complete dissipation of the accumulated electrical energy.

10. A control circuit as set forth in claim 9, wherein the load is generally constituted by a coil of a solenoid operated portable tool, and the multiple state command switch comprises a manually operable single-pole double-throw switch supported on the tool for operator actuation.

11. A control circuit as set forth in claim 10, wherein the command switch is spring biased in its first state and operator actuable to its second state to provide substantially a single half cycle excursion of alternating current to the coil to thereby operate the tool only once for each operator actuation of the switch.

12. A control circuit as set forth in claim 9, wherein the command switch comprises a manually operable switch urged to its first state and operable to its second state to provide generally only a single half cycle of alternating current to the load for each operation of the switch.

13. A control circuit as set forth in claim 9, wherein the energy storage device comprises a capacitor for accumulating energy by way of a series circuit including the command switch in its first state.

14. A control circuit as set forth in claim 9, wherein the synchronizing signal providing means comprises a solid state switching device having anode and cathode terminals and enablable to pass positive current from anode to cathode by a positive current flow from gate to cathode with the anode thereof resistively coupled to one of the terminals and the cathode thereof directly coupled to the other of the terminals, the voltage between the anode and cathode of the solid state switching device forming the synchronizing signals.

15. A control circuit as set forth in claim 9, wherein the means associated with the means for providing gating signals includes a solid state switching device having anode and cathode terminals and enabled to pass positive current flow from anode to cathode by a positive current flow from gate to cathode with the gate receiving synchronizing signals and the anode-cathode circuit being biased in the conducting direction by the stored electrical energy when the command switch is in its second state.

* * * * *